US012572077B2

(12) United States Patent
Kawakami et al.

(10) Patent No.: US 12,572,077 B2
(45) Date of Patent: Mar. 10, 2026

(54) HEAT TREATMENT APPARATUS AND HEAT TREATMENT METHOD

(71) Applicant: Tokyo Electron Limited, Tokyo (JP)

(72) Inventors: Shinichiro Kawakami, Koshi City (JP); Yohei Sano, Koshi City (JP); Tomoya Onitsuka, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 19/044,116

(22) Filed: Feb. 3, 2025

(65) Prior Publication Data

US 2025/0180996 A1 Jun. 5, 2025

Related U.S. Application Data

(63) Continuation of application No. 17/906,644, filed as application No. PCT/JP2021/010419 on Mar. 15, 2021.

(30) Foreign Application Priority Data

Mar. 24, 2020 (JP) ................................. 2020-053305

(51) Int. Cl.
*H01L 21/027* (2006.01)
*G03F 7/38* (2006.01)
*H01L 21/67* (2006.01)
*H01L 21/687* (2006.01)

(52) U.S. Cl.
CPC .............. *G03F 7/38* (2013.01); *H01L 21/027* (2013.01); *H01L 21/67103* (2013.01); *H01L 21/68742* (2013.01)

(58) Field of Classification Search
CPC ... G03F 7/38; H01L 21/027; H01L 21/67103; H01L 21/68742
See application file for complete search history.

(56) References Cited

U.S. PATENT DOCUMENTS

| | | | |
|---|---|---|---|
| 6,368,776 B1 | 4/2002 | Harada et al. | |
| 2004/0245237 A1 | 12/2004 | Shinya et al. | |
| 2018/0164689 A1* | 6/2018 | Sano ................... | H01L 21/6719 |

(Continued)

FOREIGN PATENT DOCUMENTS

| | | |
|---|---|---|
| CN | 108183068 A | 6/2018 |
| JP | H10-208997 A | 8/1998 |

(Continued)

*Primary Examiner* — Mesfin T Asfaw
(74) *Attorney, Agent, or Firm* — Armstrong Teasdale LLP

(57) ABSTRACT

Provided is a technique that, when heat-treating a substrate including an exposed resist film formed on a surface of the substrate and exhibiting a change in solubility of an exposed portion or an unexposed portion in a liquid developer by reacting with water and being heated, is capable of promoting the change in the solubility. For this purpose, a heat treatment apparatus includes: a stage 23 on which the substrate W is placed and heated; a lifting mechanism 26 configured to relatively raise and lower the substrate W between a first position at which the substrate is placed on the stage 23 and a second position spaced apart from the stage; and a gas supply 33 configured to supply a first gas having a humidity higher than that of an atmosphere in which the stage 23 is provided, to the substrate W located at the second position before moving to the first position.

8 Claims, 17 Drawing Sheets

(56)         References Cited

U.S. PATENT DOCUMENTS

2018/0182612 A1*   6/2018  Fukuoka ........... H01L 21/67017
2019/0259606 A1      8/2019  Yamamoto et al.

FOREIGN PATENT DOCUMENTS

| | | | |
|---|---|---|---|
| JP | H10-261558 | A | 9/1998 |
| JP | H11-190908 | A | 7/1999 |
| JP | 2008-218866 | A | 9/2008 |
| JP | 2009-294439 | A | 12/2009 |
| JP | 2010-135569 | A | 6/2010 |
| JP | 2013-179354 | A | 9/2013 |
| JP | 2016-530565 | A | 9/2016 |
| JP | 2017-032658 | A | 2/2017 |
| JP | 2017-173420 | A | 9/2017 |
| JP | 2018-098229 | A | 6/2018 |
| JP | 2018-107192 | A | 7/2018 |
| JP | 2019-500490 | A | 1/2019 |
| WO | 2020045302 | A1 | 3/2020 |

* cited by examiner

HEAT TREATMENT APPARATUS AND HEAT TREATMENT METHOD

CROSS-REFERENCE TO RELATED APPLICATION

The present application is a continuation of U.S. patent application Ser. No. 17/906,644, filed Sep. 19, 2022, which is a U.S. National Stage Entry of International Patent Application No. PCT/JP2021/010419, filed Mar. 15, 2021, which claims the benefit of priority to Japanese Patent Application No. 2020-053305, filed on Mar. 24, 2020, each of which is hereby incorporated herein by reference in its entirety.

TECHNICAL FIELD

The present disclosure relates to a heat treatment apparatus and a heat treatment method.

BACKGROUND

In a photolithography process in a semiconductor device manufacturing process, for example, a resist is applied on a semiconductor wafer (hereinafter, referred to as a "wafer") to form a resist film. Next, an exposure process of exposing a predetermined circuit pattern is performed on the wafer on which the resist film is formed. In addition, by heat-treating the wafer on which the exposed resist is formed, a chemical reaction of the exposed portion or the unexposed portion of the resist film progresses, making the exposed portion or the unexposed portion soluble or insoluble in a liquid developer. Thereafter, the liquid developer is supplied to the heat-treated wafer W to remove the soluble portion of the resist film and form a predetermined resist pattern on the wafer.

In recent years, there is a demand for higher integration of semiconductor devices. Therefore, miniaturization of resist patterns is required, and an exposure process by using extreme ultraviolet (EUV) has been proposed. In the exposure process using the EUV, a resist film is required to have high sensitivity to exposure, and for example, a metal-containing resist as described in Patent Document 1 is used.

PRIOR ART DOCUMENT

Patent Document

Patent Document 1: Japanese Laid-Open Publication No. 2016-530565

The present disclosure provides a technology that, when heat-treating a substrate including an exposed resist formed on a surface thereof and exhibiting a change in the solubility of an exposed portion or an unexposed portion thereof in a liquid developer by reacting with water and being heated, is capable of promoting the change in the solubility.

SUMMARY

A heat treatment apparatus of the present disclosure includes: a stage on which a substrate is placed and heated, the substrate including an exposed resist film formed on a surface of the substrate, and the exposed resist film exhibiting a change in solubility of an exposed portion or an unexposed portion in a liquid developer by reacting with water and being heated; a lifting mechanism configured to relatively raise and lower the substrate between a first position at which the substrate is placed on the stage and a second position which is spaced apart from the stage; and a gas supply configured to supply a first gas to the substrate located at the second position before moving to the first position, the first gas having a humidity higher than that of an atmosphere in which the stage is provided.

According to the present disclosure, when heat-treating a substrate including an exposed resist formed on a surface thereof and exhibiting a change in solubility of an exposed portion or an unexposed portion thereof in a liquid developer by reacting with water and being heated, it is possible to promote the change in the solubility.

BRIEF DESCRIPTION OF DRAWINGS

FIG. 2 is an operation view illustrating an operation of the heat treatment apparatus.

FIG. 3 is an operation view illustrating an operation of the heat treatment apparatus.

FIG. 4 is an operation view illustrating an operation of the heat treatment apparatus.

FIG. 5 is a vertical cross-sectional side view of a processing chamber provided in a heat treatment apparatus according to a second embodiment.

FIG. 8 is an operation view illustrating an operation of the heat treatment apparatus of the second embodiment.

FIG. 9 is a bottom plan view of a gas supply according to a third embodiment.

FIG. 11 is an explanatory view illustrating an example of gas supply in the third embodiment.

FIG. 12 is a vertical cross-sectional side view of another example of the heat treatment apparatus according to the third embodiment.

FIG. 13 is an operation view illustrating an operation of another example of the heat treatment apparatus.

FIG. 14 is an operation view illustrating an operation of another example of the heat treatment apparatus.

DETAILED DESCRIPTION

First Embodiment

Figure 1:
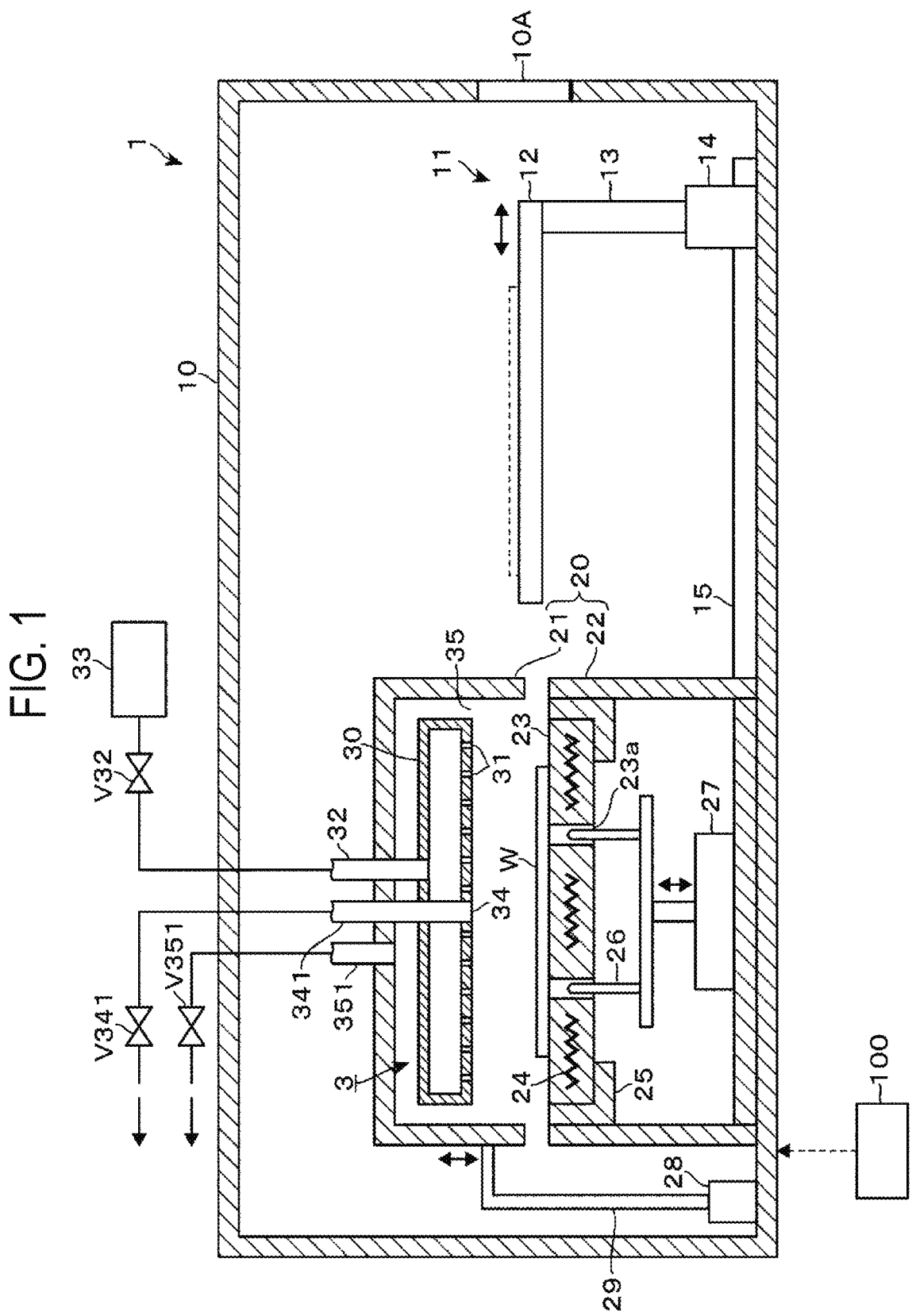
FIG. 1 a vertical cross-sectional side view of a heat treatment apparatus according to a first embodiment.

A heat treatment apparatus 1 according to the present disclosure will be described. This heat treatment apparatus 1 is an apparatus configured to heat a wafer W on which a resist film is formed, and the resist film is exposed along, for example, a circuit pattern by EUV. Therefore, the heat treatment apparatus 1 is an apparatus that performs so-called post exposure bake (PEB). A resist forming this resist film contains, for example, a metal, and an example of the metal is tin. Furthermore, when radiation such as EUV is irradiated to desorb ligands from the metal, and in that state, when the resist reacts with water, hydroxyl groups are introduced thereinto. Subsequent heating causes dehydration condensation between the hydroxyl groups, resulting in insolubilization in a liquid developer.

The heat treatment apparatus 1 performs the above introduction of hydroxyl groups (hydrophilization treatment) and dehydration condensation. Therefore, as a result of the processes performed by the heat treatment apparatus 1, the exposed region of the resist film becomes insoluble in the developer, and the unexposed area dissolves in the developer and is removed, forming a pattern in the resist film. A configuration of the heat treatment apparatus 1 will be described with reference to the vertical cross-sectional side view of FIG. 1. The heat treatment apparatus 1 includes a housing 10, and a transport port 10A for a wafer W is provided in the side wall of the housing 10. The heat treatment apparatus 1 is provided in an air atmosphere, and an interior and an exterior of the housing 10 are in the air atmosphere. A chamber (a processing chamber) 20 configured to heat-treat a wafer W is provided at the inner side of the housing 10 when viewed from a location where the transport port 10A is opened in the housing 10.

The processing chamber 20 includes a lid 21 forming a ceiling, and a lower portion 22 located below the lid 21 and including a bottom. The lid 21 forming an upper portion of the processing chamber 20 is connected to a chamber lifting mechanism 28 via a support 29. When the lid 21 is raised relative to the lower portion 22 by the lifting mechanism 28, the processing chamber 20 is separated and opened, and when the lid 21 is lowered by the lifting mechanism 28, the processing chamber 20 is closed.

A stage 23 is provided inside the lower portion 22. Reference numeral 25 in FIG. 1 denotes a holding member configured to hold the stage 23. A heater 24 is embedded in the stage 23 and configured to heat a wafer W placed on the stage 23 at a temperature of, for example, 50 degree C. to 210 degrees C. The stage 23 is provided with three through-holes 23a extending through the stage 23 in the thickness direction. Vertical lifting pins 26 are inserted through the through-holes 23a, respectively. Each lifting pin 26 is connected to a lifting mechanism 27 installed at the bottom of the lower portion 22. Each lifting pin 26 is raised and lowered by the lifting mechanism 27, and the tip of the lifting pin 26 protrudes and sinks from the surface of the stage 23. By the lifting pins 26 protruding and sinking from the surface of the stage 23, the wafer W is raised and lowered between a first position at which the wafer W is placed on the stage 23 and a second position which is spaced apart from the stage 23.

When the above-mentioned hydrophilization is insufficient on the resist film formed on the wafer W, dehydration condensation may not proceed sufficiently. Therefore, there is a possibility that a line width (a width of a convex portion) of a resist pattern formed after a developing process becomes narrower than a desired width. Therefore, the heat treatment apparatus 1 according to the present disclosure includes a gas supply 3 configured to supply humid air containing moisture to the wafer W to ensure hydrophilization of the resist film and promote dehydration condensation.

The gas supply 3 includes a shower head 30 which is provided inside the lid 21 and is a facing portion having a facing surface which faces the wafer W placed on the stage 23. The shower head 30 includes therein a diffusion space for gas diffusion. In addition, gas ejection holes 31 configured to supply gas toward the wafer W are formed to be distributed on the entire bottom surface of the shower head 30 (the facing surface which faces the wafer W).

One end of a gas supply pipe 32 is connected to the top surface of the shower head 30 to communicate with the diffusion space. The other end of the gas supply pipe 32 is provided with a gas source 33 configured to supply, via a valve V32, a first gas having a higher humidity than the atmosphere in which the stage 23 is provided. The first gas is, for example, humid air having a humidity of 68%. The "humidity" used in the present disclosure indicates relative humidity. The "atmosphere" in which the stage 23 is provided means the atmosphere above the stage 23 when the first gas is not supplied toward the wafer W from the gas supply 3. Therefore, the first gas, which is humid air, is a gas that increases the humidity of the atmosphere above the stage 23.

As the gas source 33, for example, a module capable of adjusting the moisture contained in the air and supplying air having a desired humidity is used. For example, the gas source 33 may be configured to include, for example, a bubbler, a first line that supplies water vapor generated by the bubbler to the downstream side, and a second line that supplies and mixes the water vapor flowing through the first line with air of an arbitrary flow rate. By adjusting the flow rate of the air in the second line, it is possible to supply air having a desired humidity to the shower head 30. However, the configuration of the gas source 33 is not limited to such a configuration, and the configuration of the gas source 33 may be arbitrarily configured.

A central exhaust port 34 configured to exhaust the atmosphere inside the processing chamber 20 is opened in the center of the bottom surface of the shower head 30. A central exhaust pipe 341 provided to penetrate the shower head 30 is connected to the central exhaust port 34. The shower head 30 is disposed with a gap between the side peripheral surface and the inner surface of the lid 21, and the gap constitutes an outer peripheral exhaust port 35 configured to exhaust from the outer periphery side of the wafer W. The outer peripheral exhaust port 35 communicates with an outer peripheral exhaust pipe 351. The central exhaust pipe 341 and the outer peripheral exhaust pipe 351 are connected to exhaust equipment in a factory and configured to be capable of exhausting the atmosphere inside the processing chamber 20. V341 and V351 provided in the central exhaust pipe 341 and the outer peripheral exhaust pipe 351 are valves configured to open and close the central exhaust pipe 341 and the outer peripheral exhaust pipe 351, respectively.

A transport mechanism 11 is provided at the front side (near the transport port 10A) in the housing 10. The transport mechanism 11 includes a support plate 12 which is a generally disk-shaped horizontal support, and a wafer W is placed on the surface of the support plate 12. A temperature control mechanism (not illustrated) is embedded in the support plate 12, and controls the temperature of the wafer W placed on the support plate 12 to be uniform in the plane of the wafer W. This support plate 12 is moved by a movement mechanism 14 connected thereto via a support member 13 along a guide rail 15 provided on the bottom surface of the housing 10 from the transport port 10A toward the inner side. As a result, the support plate 12 is movable between a region above stage 23 and an outer region of the processing chamber 20 located laterally away from the stage 23 (the position illustrated in FIG. 1).

When the transport mechanism 11 is located in the outer region, an external transport mechanism holding a wafer W of the heat treatment apparatus 1 enters the housing 10 via the transport port 10A. In addition, the external transport mechanism of the heat treatment apparatus 1 moves up and down from above the support plate 12, thereby delivering the wafer W between the external transport mechanism of the heat treatment apparatus 1 and the transport mechanism 11 inside the housing 10. A slit (not illustrated) is formed from an end near the processing chamber 20 toward the other end in the support plate 12. When the support plate 12 is located on the stage 23 by this slit, the lifting pins 26, which protrude and sink from the stage 23, are capable of protruding on the support plate 12 through the slit. The wafer W is delivered between the stage 23 and the support plate 12 by cooperation between the lifting pins 26 moving up and down and the transport mechanism 11 moving forward and backward.

The heat treatment apparatus 1 includes a controller 100 including, for example, a computer. The controller 100 is configured to be capable of outputting control signals to the chamber lifting mechanism 28, the lifting mechanism 27, the valves V 32, V 341 and V 351, and the movement mechanism 14. The controller 100 stores a program in which instructions (step groups) are assembled such that a sequence of delivering of a wafer W, raising/lowering of the lifting pins 26 and the lid 21, and gas supply in the operation of the heat treatment apparatus 1, which will be described later, is executed. This program is stored in a storage medium such as a compact disk, a hard disk, a magneto-optical disk (MO), a DVD, or a memory card and installed in the controller 100.

The operation of the heat treatment apparatus 1 according to the present disclosure will be described. The heat treatment apparatus 1 is on standby in the state in which the stage 23 heated to a temperature of, for example, 50 degrees C. to 210 degrees C. by the heater 24 and the processing chamber 20 is opened and evacuated from each of the exhaust ports 34 and 35. The support plate 12 is on standby at a position where a wafer W is received (the position indicated by the solid line in FIG. 1). First, the external transport mechanism (not illustrated) holding an exposed wafer W is moved into the heat treatment apparatus 1 and moved downward from above the support plate 12 to place the wafer W on the support plate 12.

Figure 2:
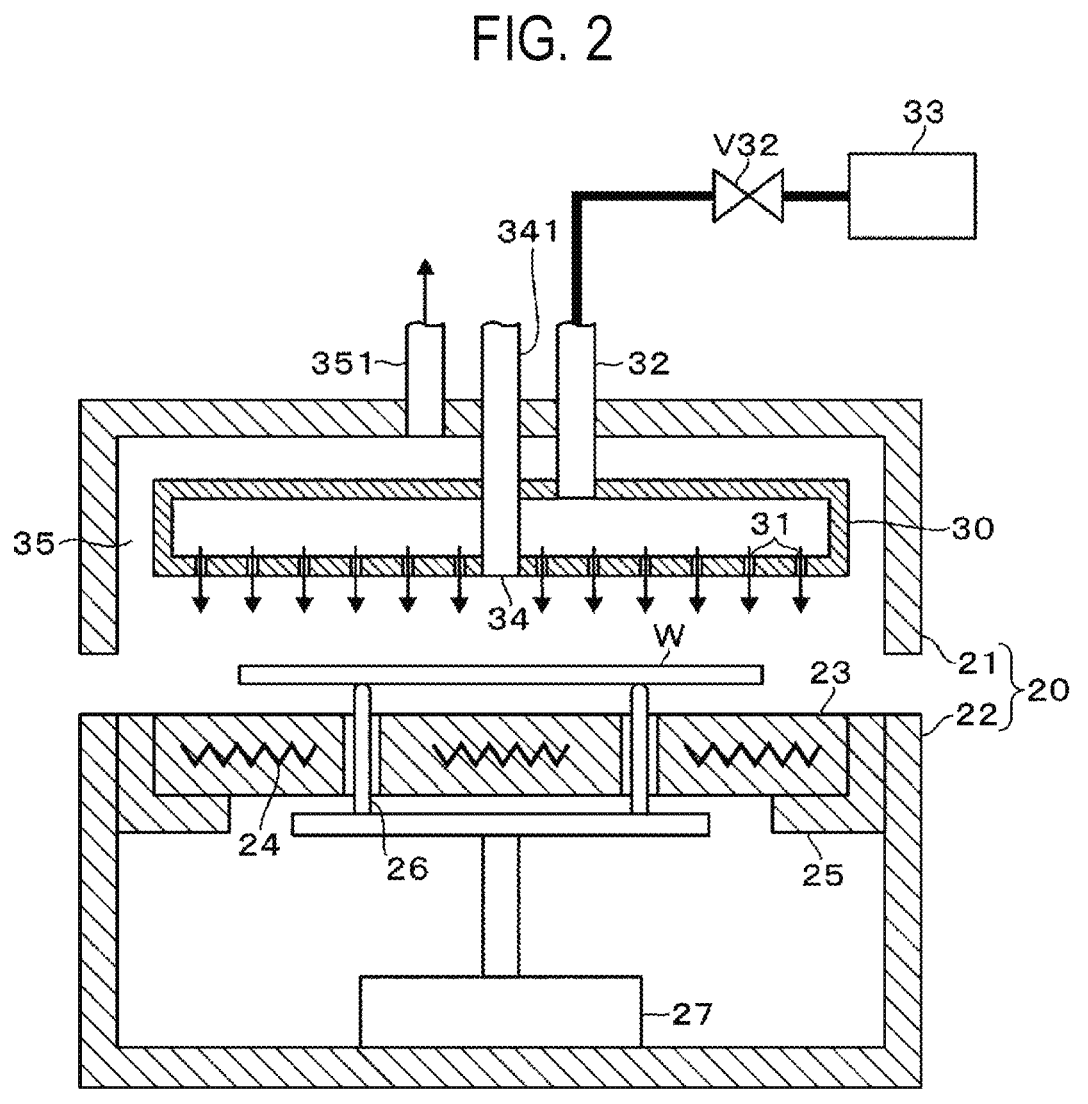

Then, the support plate 12 is moved to directly above the stage 23. In addition, the wafer W supported by the support plate 12 is pushed up by the lifting pins 26 and supported at the second position on the stage 23, and the support plate 12 is retracted to the external area. Subsequently, as illustrated in FIG. 2, the first gas is supplied toward the wafer W, and exhaust is performed, for example, from the outer peripheral exhaust port 35 among respective exhaust ports. At this time, the lid 21 is still raised, and the processing chamber 20 is opened. Moisture is supplied to the wafer W by being exposed to the first gas, which is humid air, and the resist film is hydrophilized.

Figure 3:
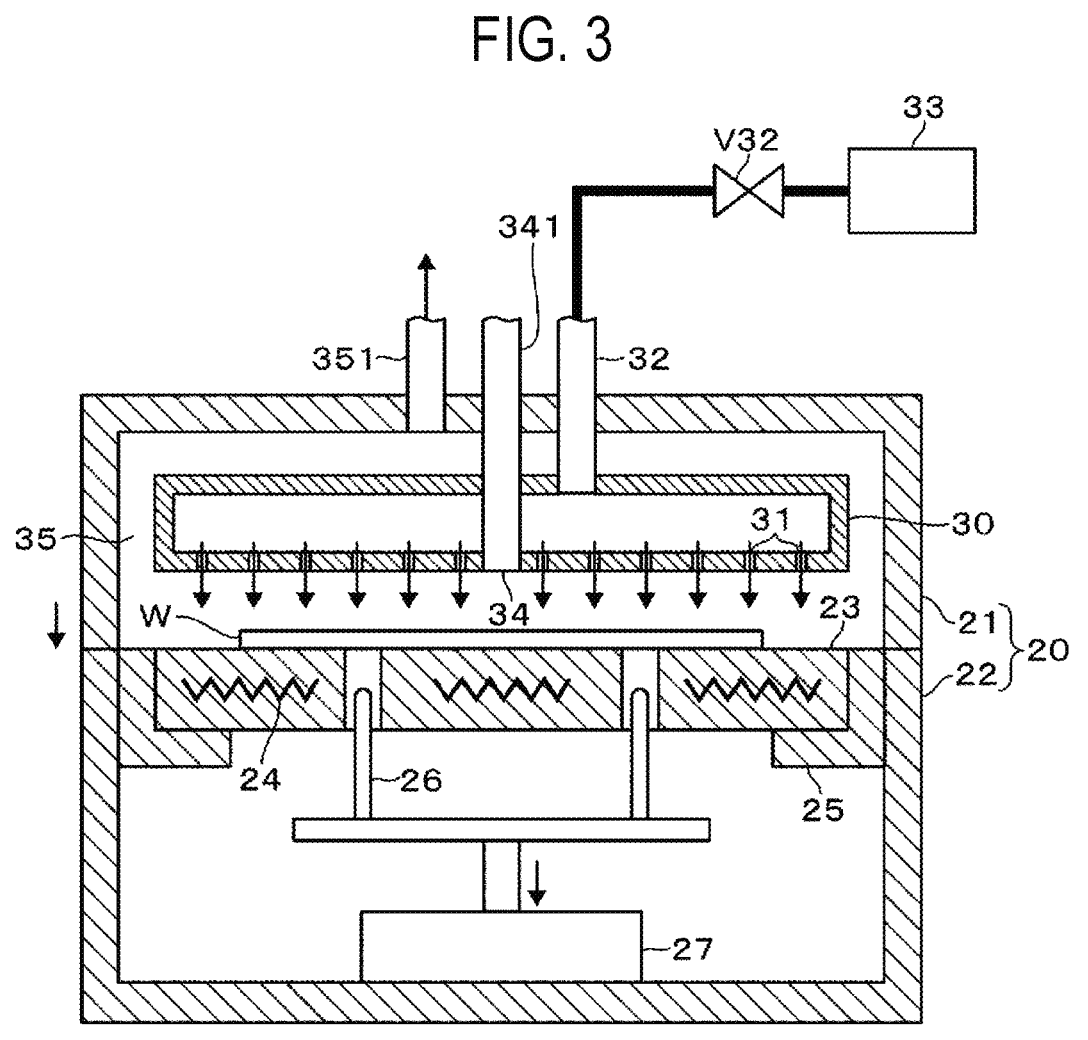

Subsequently, as illustrated in FIG. 3, while supplying the first gas and exhausting from the outer peripheral exhaust port 35, the lifting pins 26 are lowered and the wafer W moves to the placement position (the first position) of the stage 23. For example, the lid 21 is lowered in parallel with the lowering of the lifting pins 26 to close the processing chamber 20. By being placed on the stage 23 in this manner, the wafer W is heated to the same temperature as the stage 23 and heat-treated. As the temperature of the wafer W rises, the above-described dehydration condensation of hydroxyl groups occurs, and an exposed portion of the resist film become insoluble in the liquid developer.

Figure 4:
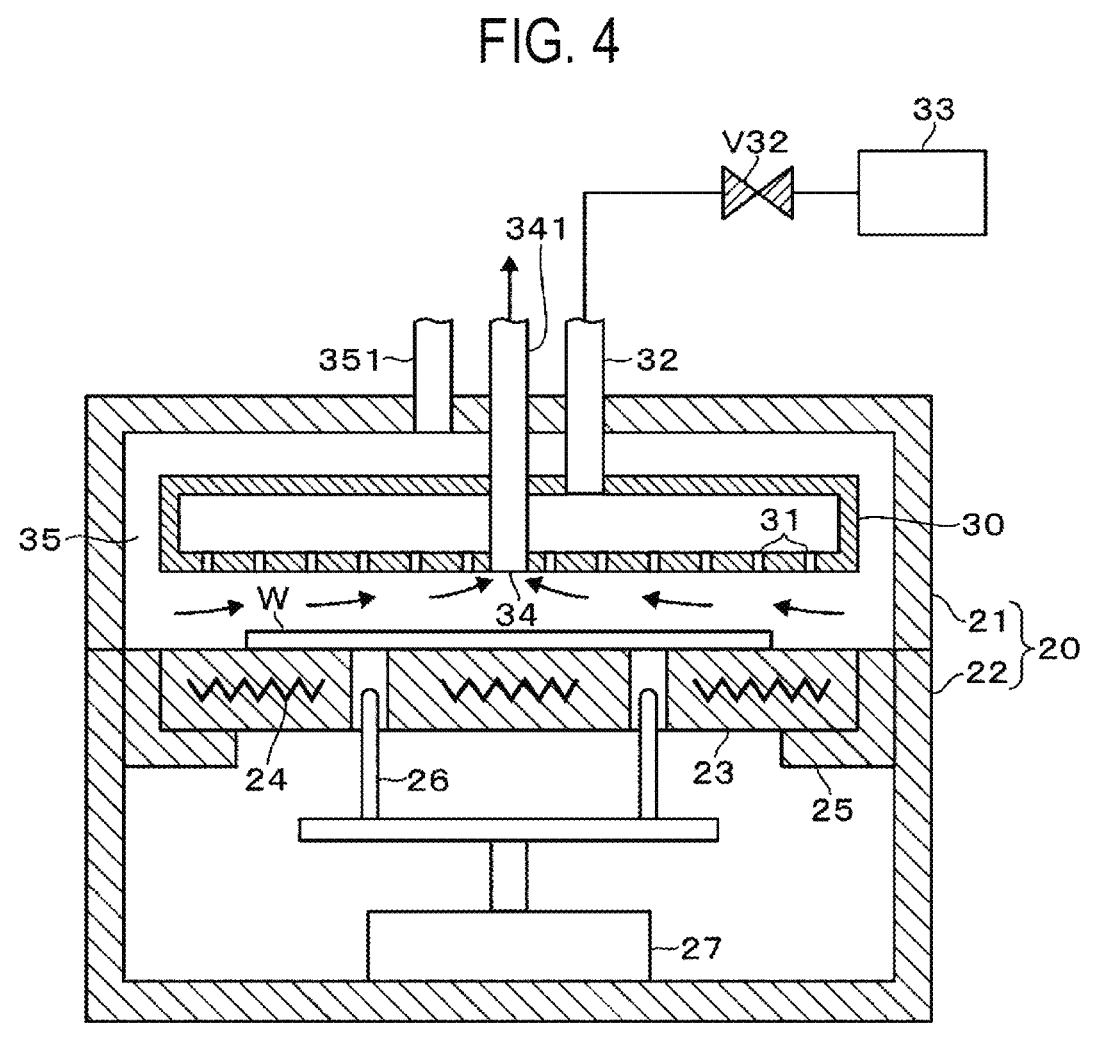

When the heat treatment of the wafer W is completed, as illustrated in FIG. 4, the supply of the first gas is stopped, the exhaust through the outer exhaust port 35 is stopped, and the exhaust is switched to be performed through the central exhaust port 34. After that, the lid 21 is raised to open the processing chamber 20, and the lifting pins 26 are raised to raise the wafer W from the stage 23. Then, the wafer W is delivered to the transport mechanism 11 by the cooperation of the transport mechanism 11 and the lifting pins 26. In addition, the wafer W is transferred to the external transport apparatus, carried out from the heat treatment apparatus 1, and subjected to a developing process.

According to the heat treatment apparatus 1, air (first gas) having a higher humidity than the atmosphere on the stage 23 is supplied to the wafer W to perform the heat treatment. Therefore, during the heat treatment, hydroxyl groups are sufficiently introduced into the exposed portion of the resist film, and the insolubilization of the exposed portion progresses rapidly during the heat treatment. In other words, the sensitivity of reaction due to heating is enhanced in the exposed portion. Since the insolubilization of the exposed portion is accelerated in this way, the insolubilization is insufficient during the developing process, which suppresses a width of the convex portion of the resist pattern from being smaller than a set value.

After the wafer W is placed on the stage 23 and heated, it may be considered that the heat of the wafer W may reduce the adhesion of moisture contained in the first gas to the resist film. However, with the heat treatment apparatus 1, since the first gas is supplied before the wafer W is placed on the stage 23, heating is performed in a state in which hydroxyl groups are reliably introduced. Therefore, it is possible to perform the rapid insolubilization of the exposed portion with high reliability. Since the position where the first gas is supplied is above the stage 23, after the introduction of hydroxyl groups, it is possible to rapidly place the wafer W on the stage 23 and to perform heat treatment.

Therefore, drying occurs in the plane of the wafer W under an influence of air flow in the region where the wafer W moves until the wafer W is placed on the stage 23 from the supply of the first gas. As a result, variation in a permeation amount of the moisture of the resist within the surface of the wafer W before the wafer W is placed on the stage 23 is suppressed. That is, variation in the introduced state of hydroxyl groups in the plane of the wafer W is suppressed, such that it is possible to suppress variation in a line width of a pattern in the plane of the wafer W after development.

In addition, since the first gas is supplied in the state in which the wafer W is disposed at the second position, it is possible to supply the first gas having a high humidity to the wafer W located closer to the shower head 30 compared to the state in which the wafer W is placed on the stage 23. That is, since the space between the surface of the wafer W and the first gas supply is narrower than that when the heat treatment is performed on the wafer W, the air flow is less likely to occur on the wafer W, thereby allowing the moisture to permeate more uniformly in the plane of the wafer W. In addition since the wafer W is located at the second position and the first gas is supplied before the process of heating the wafer W is performed, sublimate generation due to the process of heating the wafer W is also small. Therefore, by making the exhaust of the interior of the processing chamber 20 weaker than the exhaust during the heat treatment of the wafer W (while the wafer W is placed on the stage 23), turned off the exhaust, or the like, the air flow around the wafer W may be further adjusted to prevent the air flow over the wafer W from increasing more than necessary while preventing sublimate leakage.

In some cases, an exposure apparatus that emits EUV from a light source may be used as in the present embodiment to miniaturize the resist pattern. However, with such an exposure apparatus using EUV, the light output from the light source is relatively small. Therefore, the resist is required to change its solubility at a relatively low dose, that is, to have high sensitivity. As described above, the metal-containing resist used in the present embodiment reacts with moisture with high sensitivity due to desorption of ligands. As described above, the present technology utilizes this characteristics of the resist to change the solubility of the resist film in the liquid developer. Therefore, according to the present technology, it is possible to reliably form a pattern on a resist film even in a case where an exposure apparatus with a low output such as EUV is used. With the heat treatment apparatus 1, the supply of the first gas is continued even after the wafer W is placed on the stage 23. Therefore, it is possible to obtain a pattern having a desired line width by more reliably introducing hydroxyl groups into the resist film to promote the insolubilization reaction of the exposed portion in the film.

The wafers W to be processed by the heat treatment apparatus 1 according to the present disclosure are not limited to metal-containing resists, and any resist may be used as long as it reacts with water and is heated to change the solubility of the exposed portion or the unexposed portion thereof in the liquid developer. Therefore, for example, a resist in which an unexposed portion is rendered soluble or insoluble by reaction or an exposed portion is rendered soluble by reaction may be used. Even with this resist, it is possible to reliably change the solubility of the resist in the exposed portion or the unexposed portion by the present technology. The metal-containing resist means that a metal is contained not as an impurity but as a main component.

Furthermore, the humidity of the first gas is preferably higher than 60%. By increasing the humidity to be higher than 60%, as illustrated in the examples below, it is possible to greatly improve the reaction rate and thus to obtain a great effect. There are cases where the humidity of gas is described, but the gas of which the humidity is described is not limited to air. Therefore, the first gas may be a gas other than air. In the embodiments to be described later, there are cases where processes are performed by using a gas having a high humidity and a gas having a low humidity, respectively, wherein these gases are also gases having a high humidity and a low humidity when measured with a hygrometer, and these gases are not limited to air.

Further, the supply flow rate of the first gas supplied to the wafer W may be decreased when the processing chamber 20 is opened, and the supply flow rate of the first gas supplied to the wafer W may be increased when the processing chamber 20 is closed. For example, in the heat treatment apparatus 1 illustrated in FIG. 1, the gas supply pipe 32 is provided with a flow rate adjuster so that the flow rate of the gas ejected from the shower head 30 may be adjusted. When the processing chamber 20 is opened, the wafer W is located at the second position on the stage 23, and the first gas is supplied as illustrated in FIG. 2, the flow rate of the first gas is set to a first flow rate. Further, after the wafer W is placed on the stage 23 and the processing chamber 20 is closed by lowering the lid 21 as illustrated in FIG. 3, the flow rate of the first gas is set to a second flow rate larger than the first flow rate.

By reducing the flow rate of the first gas supplied to the wafer W when the processing chamber 20 is opened in this way, it is possible to suppress the amount of the first gas flowing out of the processing chamber 20. This makes it possible to suppress dew condensation due to a high-humidity atmosphere outside the processing chamber 20. By increasing the flow rate of the first gas after the processing chamber 20 is closed, it is possible to supply a sufficient amount of the first gas to the wafer W, and thus to sufficiently hydrophilize the resist film.

The timing of lowering the lid 21 of the processing chamber 20 may be simultaneous with the lowering of the lifting pins 26 or may be delayed from the lowering of the lifting pins 26. Further, the exhaust ports of the processing chamber 20 are not limited to being provided to perform the exhaust from above the central portion of the wafer W and the exhaust from the outer periphery of the wafer W, and may be configured to perform only one of the exhausts.

Second Embodiment

Figure 5:
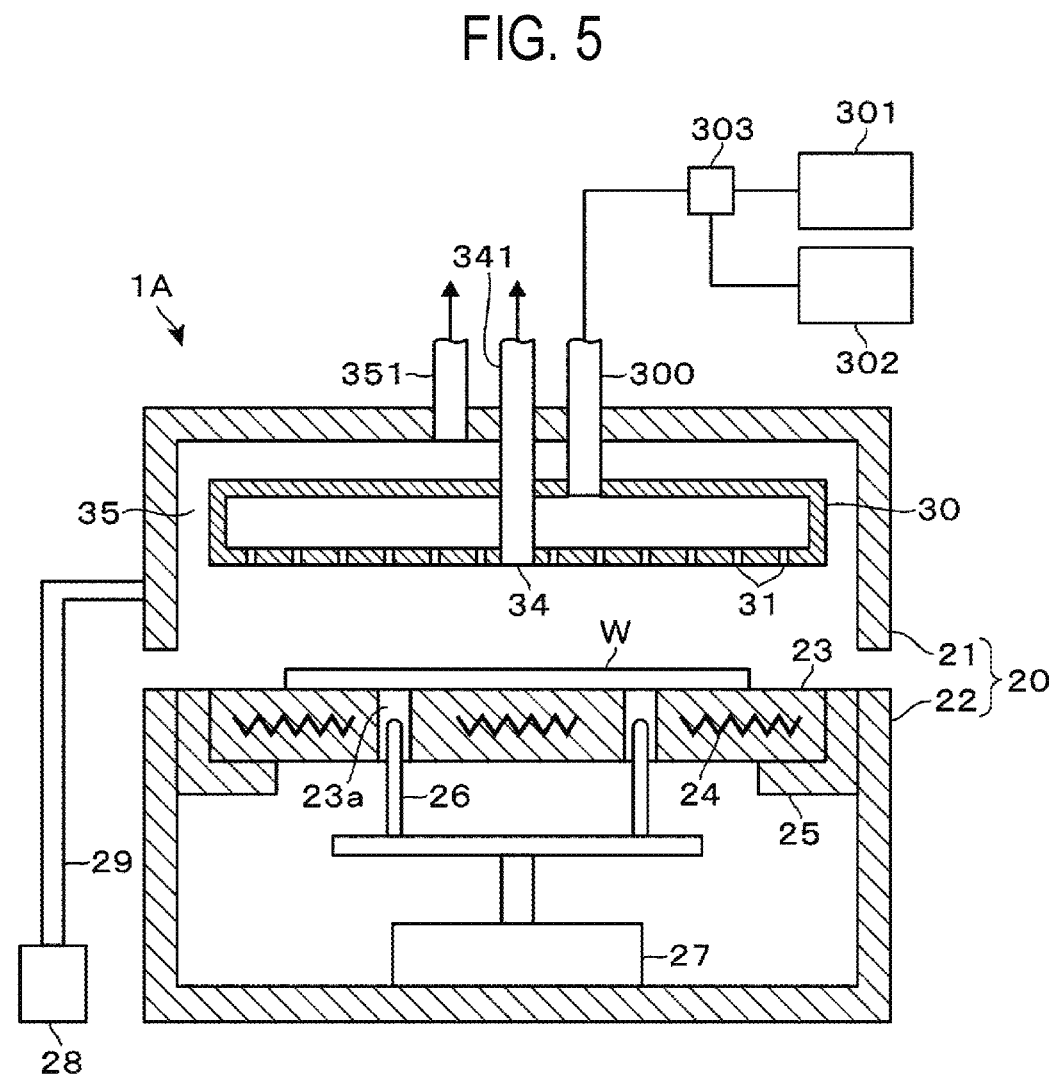

Next, a heat treatment apparatus 1A according to a second embodiment of the present disclosure will be described. In the drawings of this heat treatment apparatus 1A and heat treatment apparatuses 1B and 1C, which will be described later, the same configuration as the heat treatment apparatus 1 of the first embodiment is omitted, and only a portion of the processing chamber 20 is illustrated. In the heat treatment apparatus 1A, as illustrated in FIG. 5, a gas supply pipe 300, one end of which communicates with the diffusion space of the shower head 30, is branched into two portions at the other end side. A first gas source 301 configured to supply a first gas is installed at one end portion of the other end of the gas supply pipe 300, and a second gas source 302 configured to supply a second gas having a lower humidity than the first gas is installed at the other end portion of the other end of the gas supply pipe 300. The first gas is, for example, air having a humidity of 68%, and the second gas is, for example, air having a humidity of 20%.

Reference numeral 303 provided to the gas supply pipe 300 denotes a three-way valve configured to switch the gas supplied to the shower head 30 between the first gas and the second gas. Alternatively, instead of the three-way valve 303, a mixing box may be provided to supply the first gas and the second gas by changing a mixing ratio of a high-humidity gas and a low-humidity gas.

Figure 6:
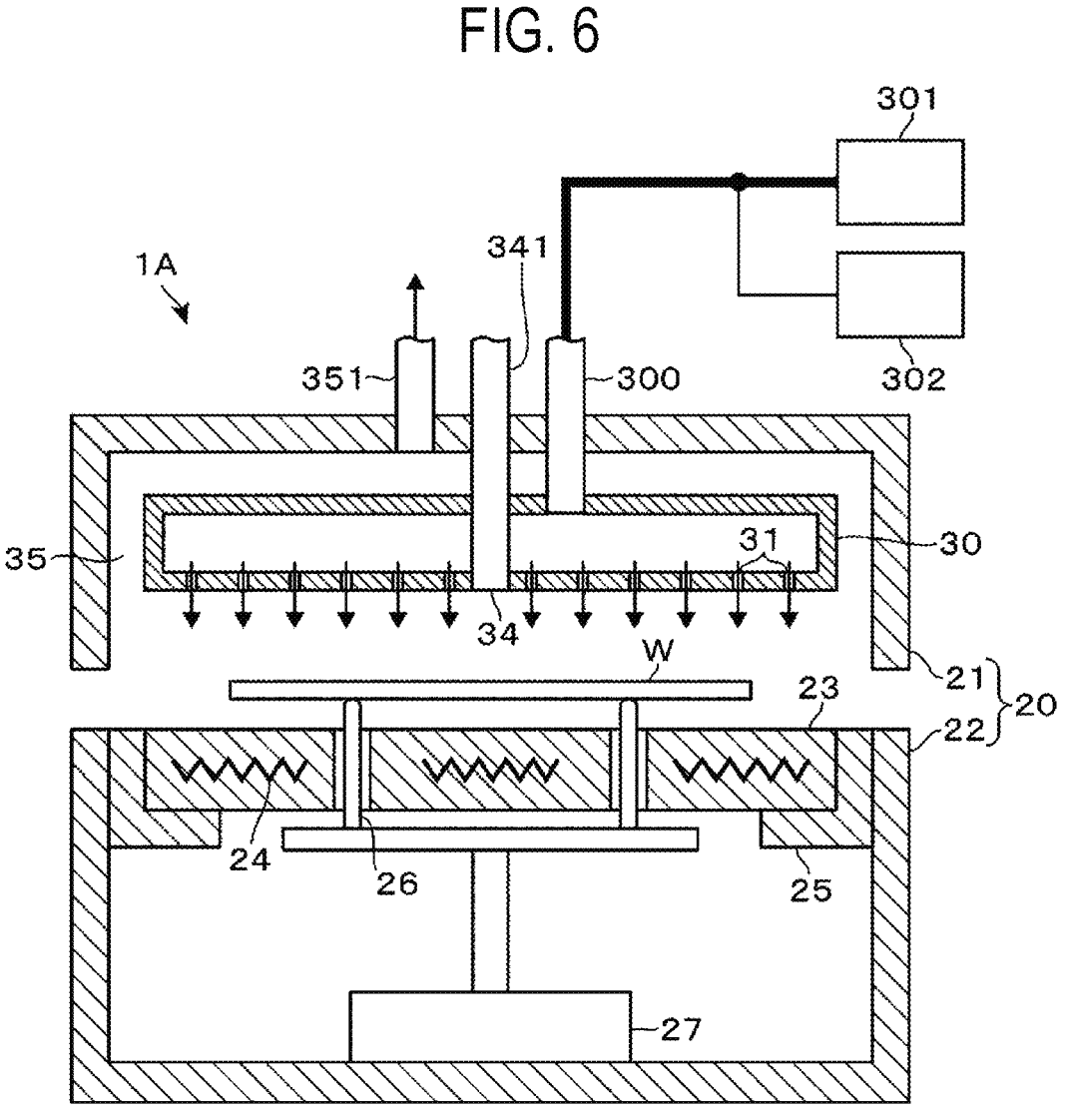
FIG. 6 is an operation view illustrating an operation of the heat treatment apparatus of the second embodiment.
Figure 7:
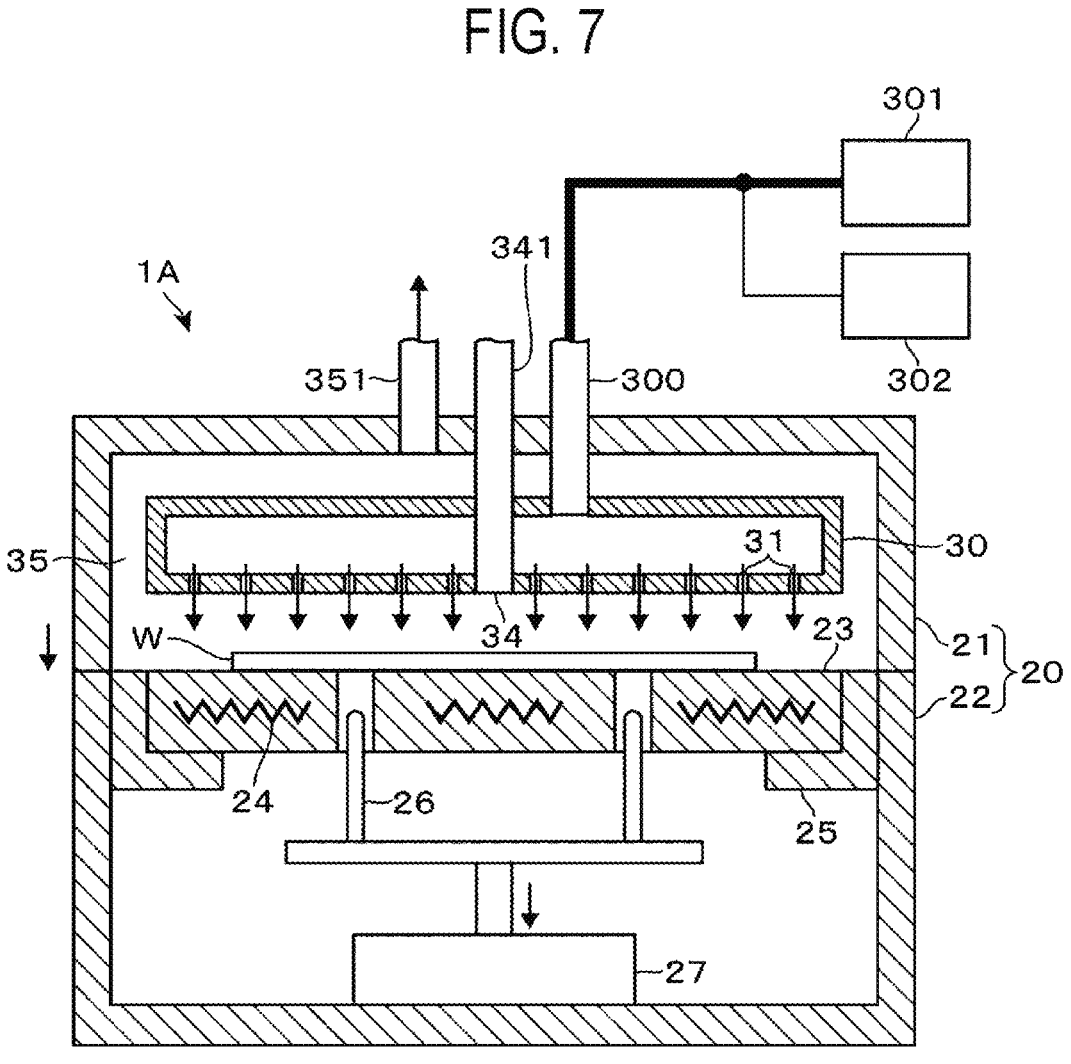
FIG. 7 is an operation view illustrating an operation of the heat treatment apparatus of the second embodiment.
Figure 8:
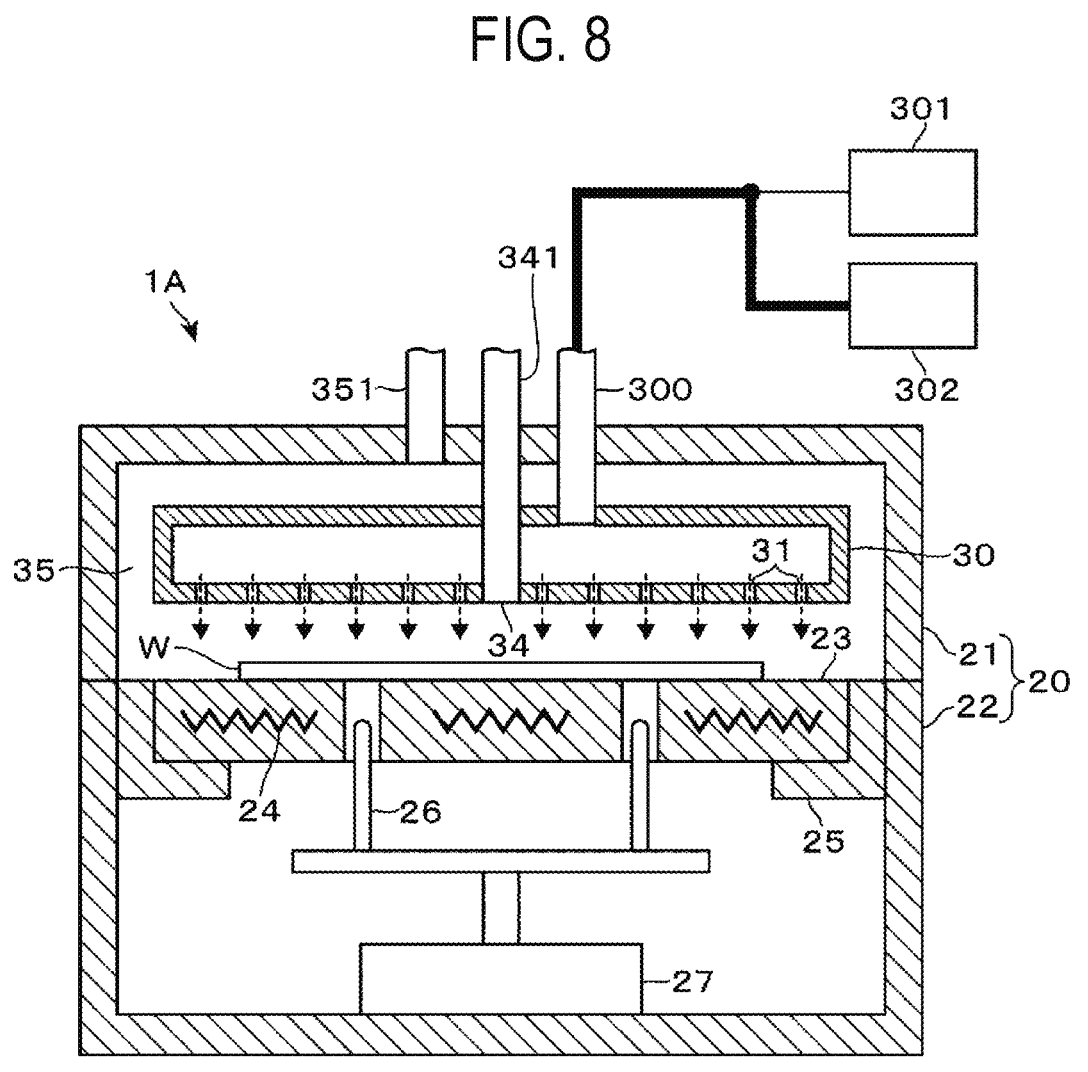

Before the wafer W carried into the heat treatment apparatus 1A is placed on the stage 23, the wafer W is supplied with the first gas at the second position as illustrated in FIG. 6. Next, as illustrated in FIG. 7, the wafer W is placed on the stage 23 (moved to the first position) while the first gas is supplied, heat treatment is initiated, and the processing chamber 20 is closed. Thereafter, the gas to be supplied to the wafer W is switched to the second gas in the state in which the heat treatment is performed on the wafer W (FIG. 8).

The reaction rate may be increased by performing the heat treatment while supplying the high-humidity gas, but in a case where the wafer W is subjected to heat treatment with an excessive amount of moisture supplied thereto, roughness of the surface of the resist film and the in-plane uniformity of the line width of the resist pattern may be deteriorated. Therefore, when heat-treating the wafer W, by lowering the humidity of the supplied gas is lowered according to the progress of the reaction of the resist film and adjusting the amount of moisture supplied to the wafer W, it is possible to suppress deterioration of the roughness of the surface of the resist film and in-plane uniformity of the line width of the resist pattern.

When the wafer W is being heat-treated, it is difficult to make the amount of moisture uniform in the plane of the wafer W. Thus, when heating the wafer W while supplying humid air having a high humidity, a difference in the amount of moisture may easily occur in the plane of the wafer W. Therefore, as illustrated in FIG. 5, after the first gas is supplied to the wafer W located at the second position before being placed on the stage 23, and before the wafer W is placed on the stage 23, the gas supplied to the wafer W may be switched to the second gas. Then, the wafer W in the state of being supplied with the second gas may be placed on the stage 23, and heat treatment may be performed on the wafer W while the second gas is supplied as illustrated in FIG. 8.

The second gas having a lower humidity than the first gas may be an inert gas such as nitrogen (N$_2$) gas. From the viewpoint of sufficiently changing the humidity of the gas supplied to the wafer W, the humidity difference between the first gas and the second gas is preferably, for example, 20% or more.

Third Embodiment

Figure 9:
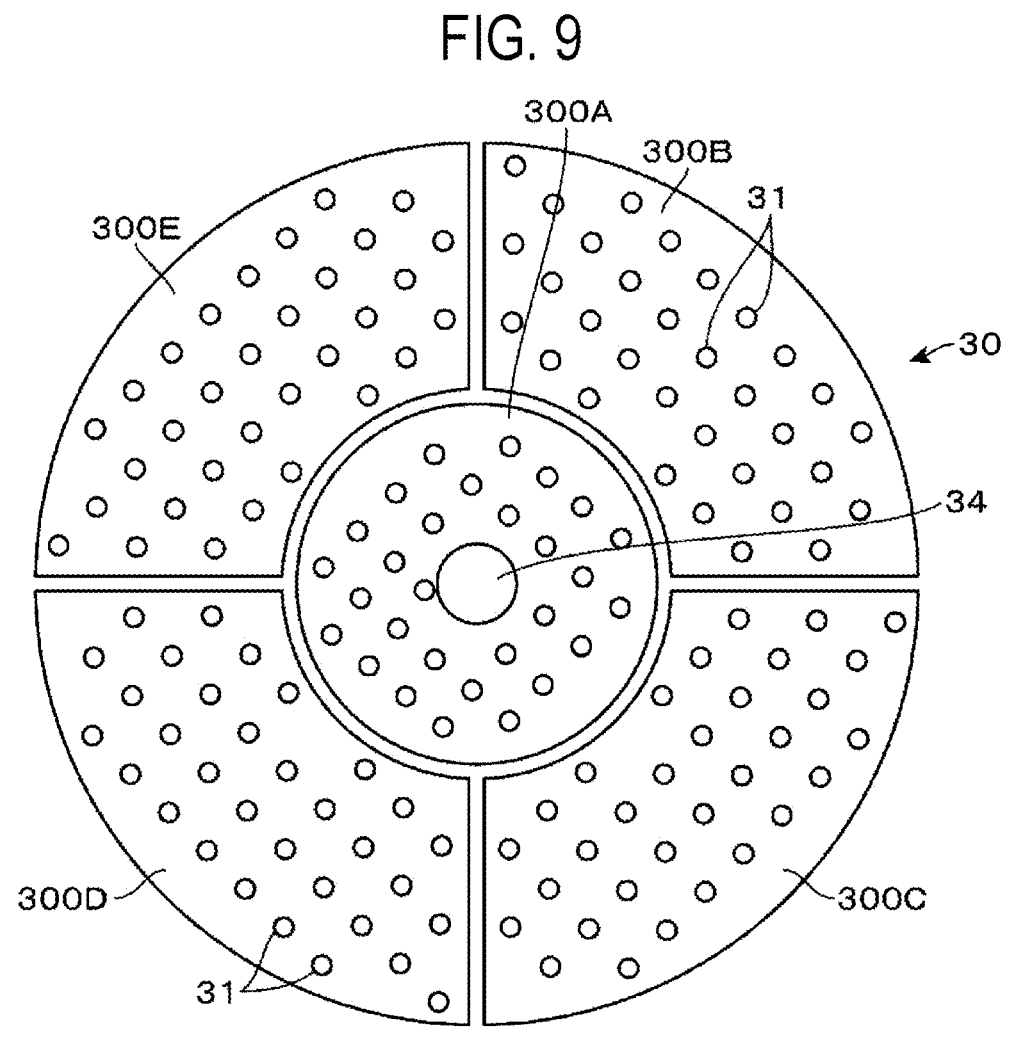
Figure 10:
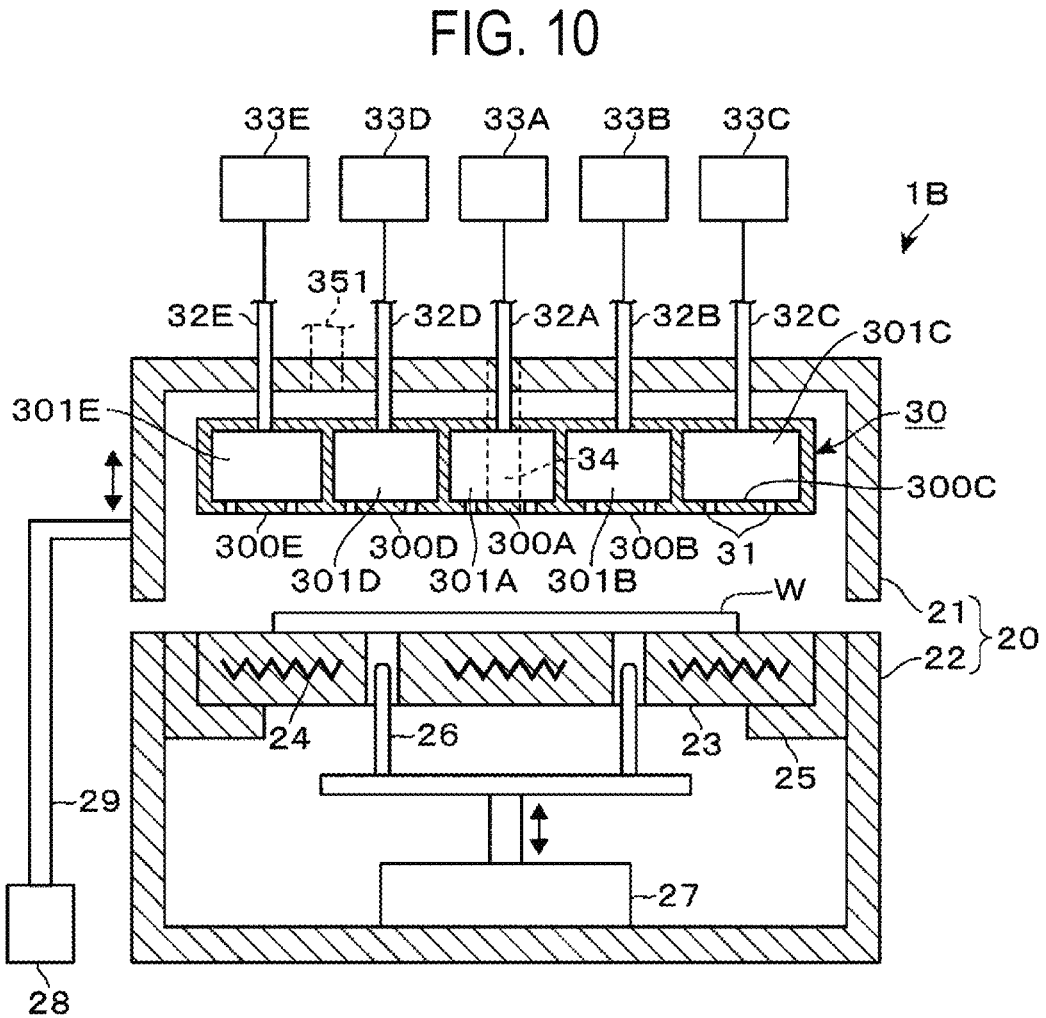
FIG. 10 is a vertical cross-sectional side view of a processing chamber provided in a heat treatment apparatus according to the third embodiment.

The humidity of a gas supplied to a wafer W may be adjusted within the plane of the wafer W. FIG. 9 is a bottom plan view of an example of a shower head 30 provided in such a heat treatment apparatus 1B. For example, when the shower head 30 is viewed from below, five gas supply regions 300A to 300E including a central gas supply region 300A and four gas supply regions 300B to 300E, each of which is obtained by dividing the region surrounding the central region into four in the circumferential direction, are provided, and gas ejection holes 31 are formed in each of the gas supply regions 300A to 300E. Further, as illustrated in FIG. 10, five sections 301A to 301E are configured inside the shower head 30 to correspond to respective areas, and gas sources 33A to 33E are connected to the sections 301A to 301E via gas supply pipes 32A to 32E, respectively. In FIG. 10, the five sections 301A to 301E are illustrated as being arranged in the horizontal direction for convenience.

Figure 11:
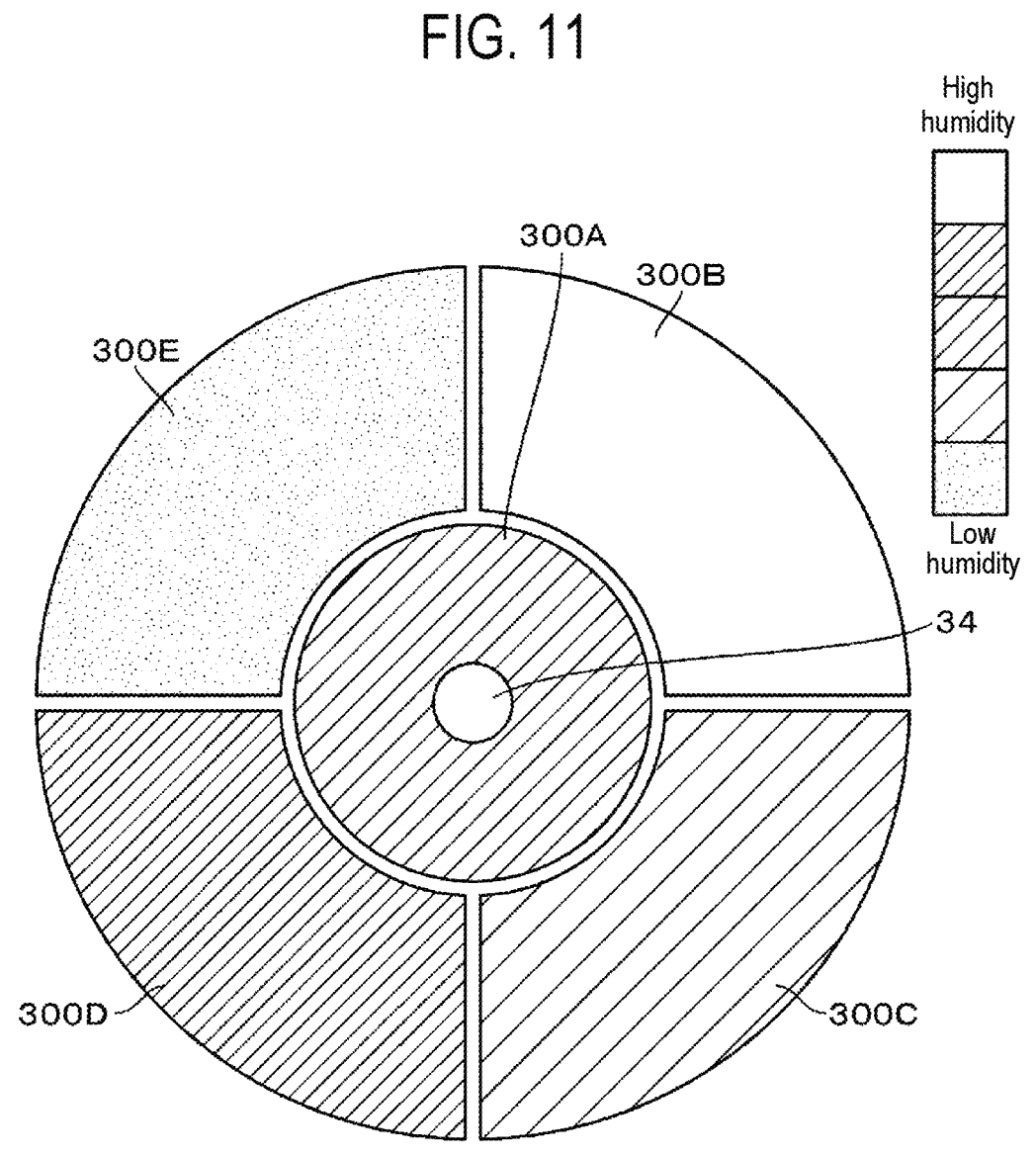

For example, when the first gas is supplied to the wafer W placed on the stage 23 (moved to the first position) and subjected to a heating process as illustrated in FIG. 3, the humidity of the first gas supplied from respective region 300A to 300E, as illustrated in FIG. 11, is adjusted such that the humidity decreases in the order of, for example, gas supply regions 300B, 300D, 300A, 300C, and 300E. By adjusting the humidity of the humid air supplied in the plane of the wafer W in this manner, it is possible to adjust the amount of moisture supplied to the resist film in the plane of the wafer W. By adjusting the moisture supplied to the wafer W in the plane, it is possible to adjust the reaction rate of the resist in the wafer W plane. When heat treatment is performed while supplying the first gas to the wafer W located at the second position before being placed on the stage 23, the humidity of the first gas supplied to the wafer W may be adjusted in the plane of the wafer W.

It is also assumed that, when the resist pattern is formed on the wafer W by performing the processes as described in the first embodiment, the line width of the resist pattern tends to be narrower at the peripheral portion than at the central portion of the wafer W. In order to cancel this tendency, in addition to supplying the first gas over the entire surface of the wafer W, the first gas may be further supplied toward the peripheral edge of the wafer W. FIG. 11 illustrates a processing chamber 20 provided at such a heat treatment apparatus 1C. The processing chamber 20 includes a shower head 30A (hereinafter, referred to as a "facing gas supply") that supplies the first gas from a facing portion facing the wafer W placed on the stage 23, similarly to the heat treatment apparatus 1 illustrated in FIG. 1.

Further, the heat treatment apparatus 1C includes an outer peripheral gas supply 30B that supplies the first gas from the outer peripheral side toward the central portion of the wafer W.

Figure 12:
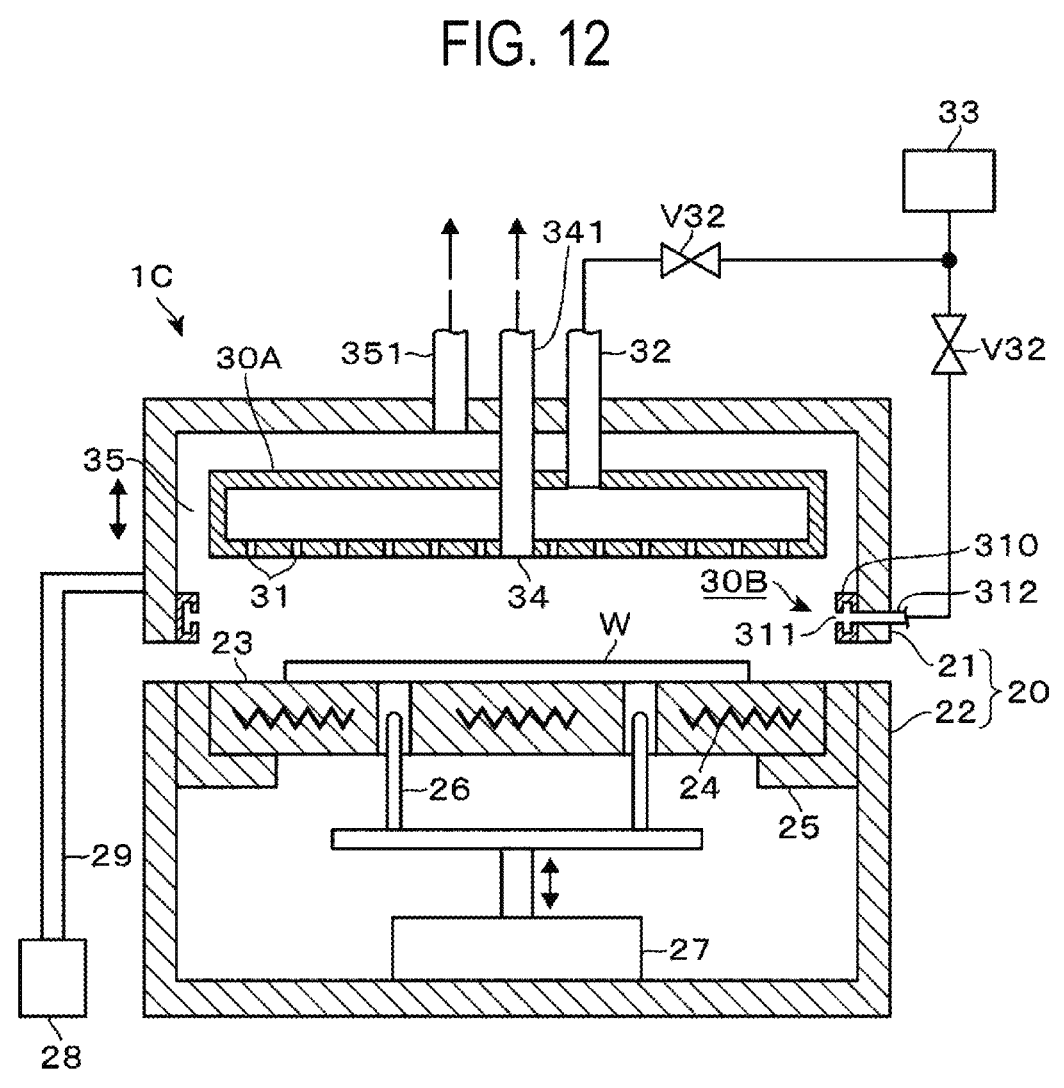

The outer peripheral gas supply 30B is provided along the inner surface of the lower end of the lid 21, for example, by forming a pipe 310 having a rectangular cross section in an annular shape. Gas ejection holes 311 is provided at the inner wall of the pipe 310 in the circumferential direction of the wafer W to supply the first gas from the outer peripheral side of the wafer W placed on the stage 23 when the lid 21 is lowered to seal the processing chamber 20. One end of a gas supply pipe 312 is connected to the pipe 310, and the other end of the gas supply pipe 312 is connected to the gas supply pipe 32, which supplies gas to the facing gas supply 30A, and configured to be supplied with the first gas from the gas source 33. Reference numeral V312 in FIG. 12 denotes a valve.

Figure 13:
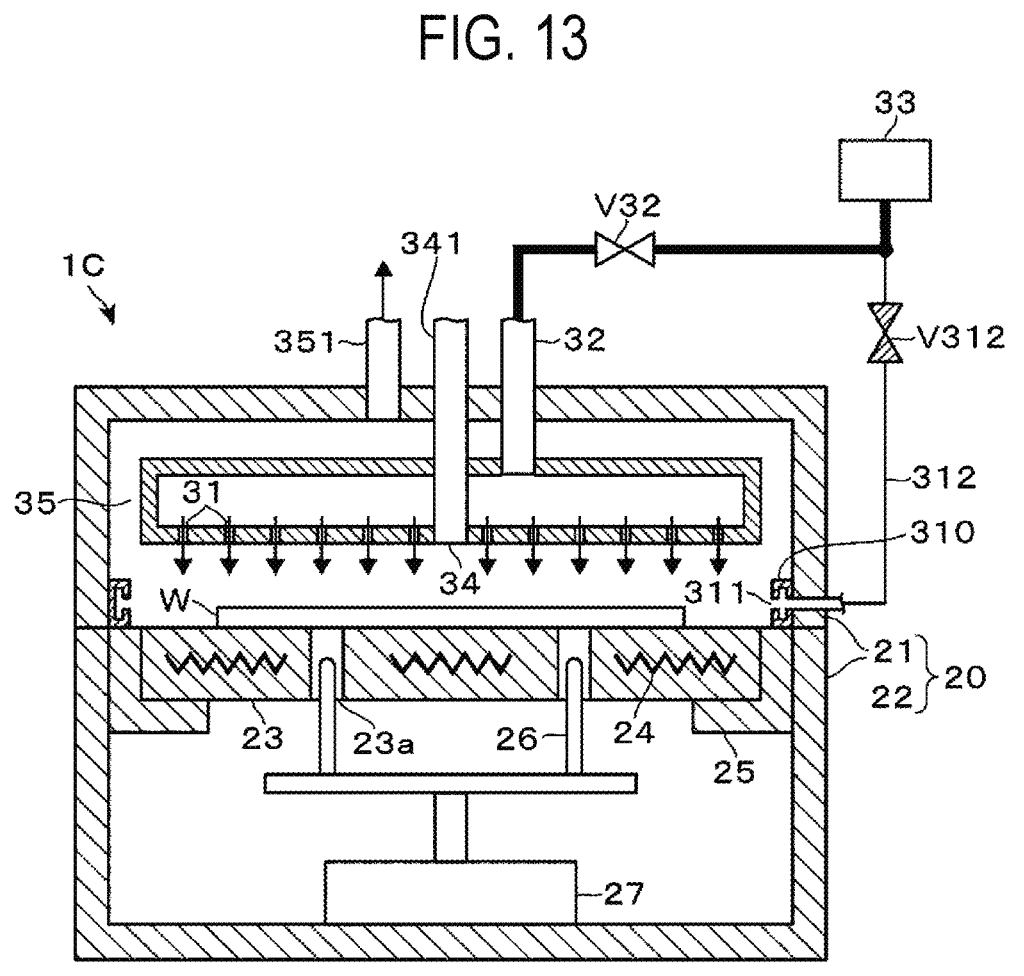
Figure 14:
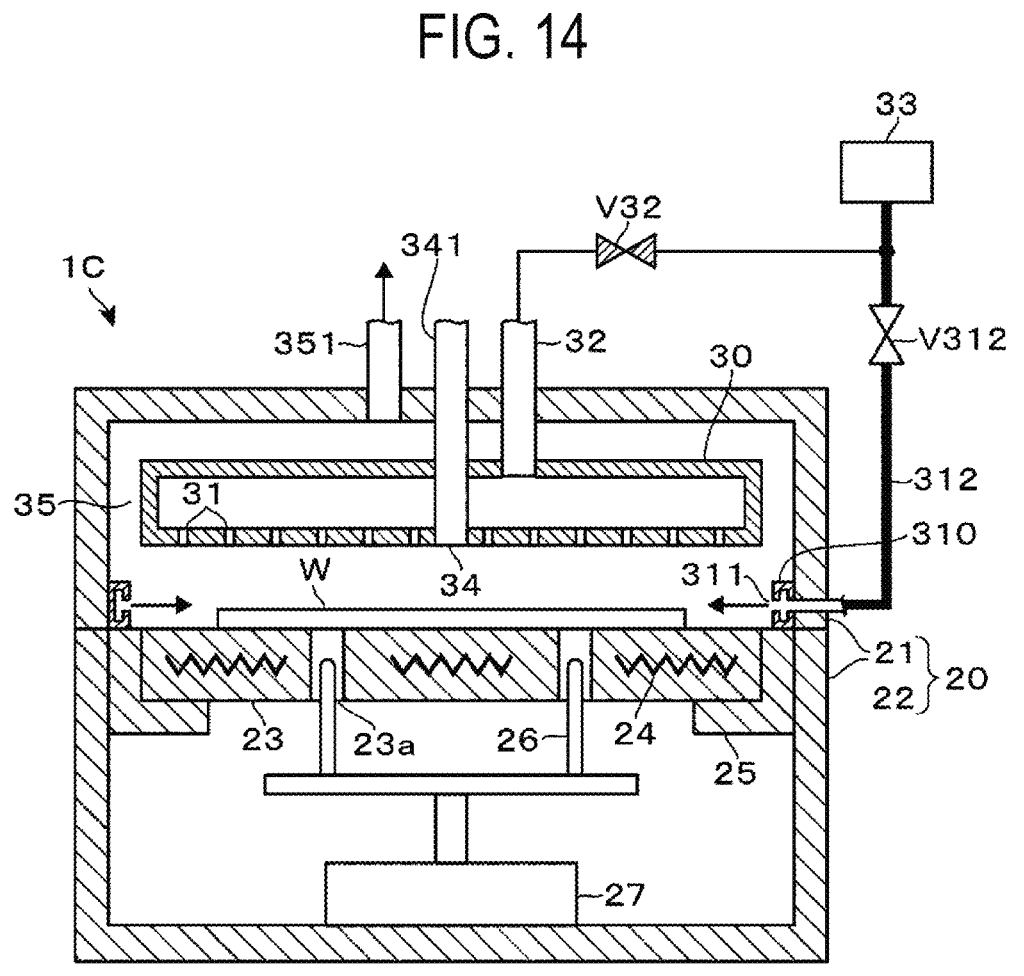

The heat treatment apparatus 1C supplies the first gas from the facing gas supply 30A toward the wafer W located at the second position before being placed on the stage 23, for example, as illustrated in FIG. 2. Next, as illustrated in FIG. 13, the wafer W is lowered and placed on the stage 23 while the gas is being ejected from the facing gas supply 30A, and the lid 21 is lowered to close the processing chamber 20. As a result, the heat treatment of the wafer W is performed while the first gas is supplied to the entire surface of the wafer W. Next, in the state in which the wafer W is placed on the stage 23 as illustrated in FIG. 14, the supply of the first gas from the facing gas supply 30A is stopped, and the supply of the first gas is performed from the outer peripheral gas supply 30B. Then, the step illustrated in FIG. 13 and the step illustrated in FIG. 14 are repeated multiple times.

This makes it possible to make the supply amount of the first gas in the region on the outer peripheral side of the wafer W larger than the supply amount of the first gas in the region on the center side of the wafer W. Therefore, since the amount of moisture in the region on the outer peripheral side of the wafer W increases, it is possible to increase the reaction rate. This makes it possible to suppress reduction of the line width of the resist pattern at the outer peripheral side of the wafer W.

Figure 15:
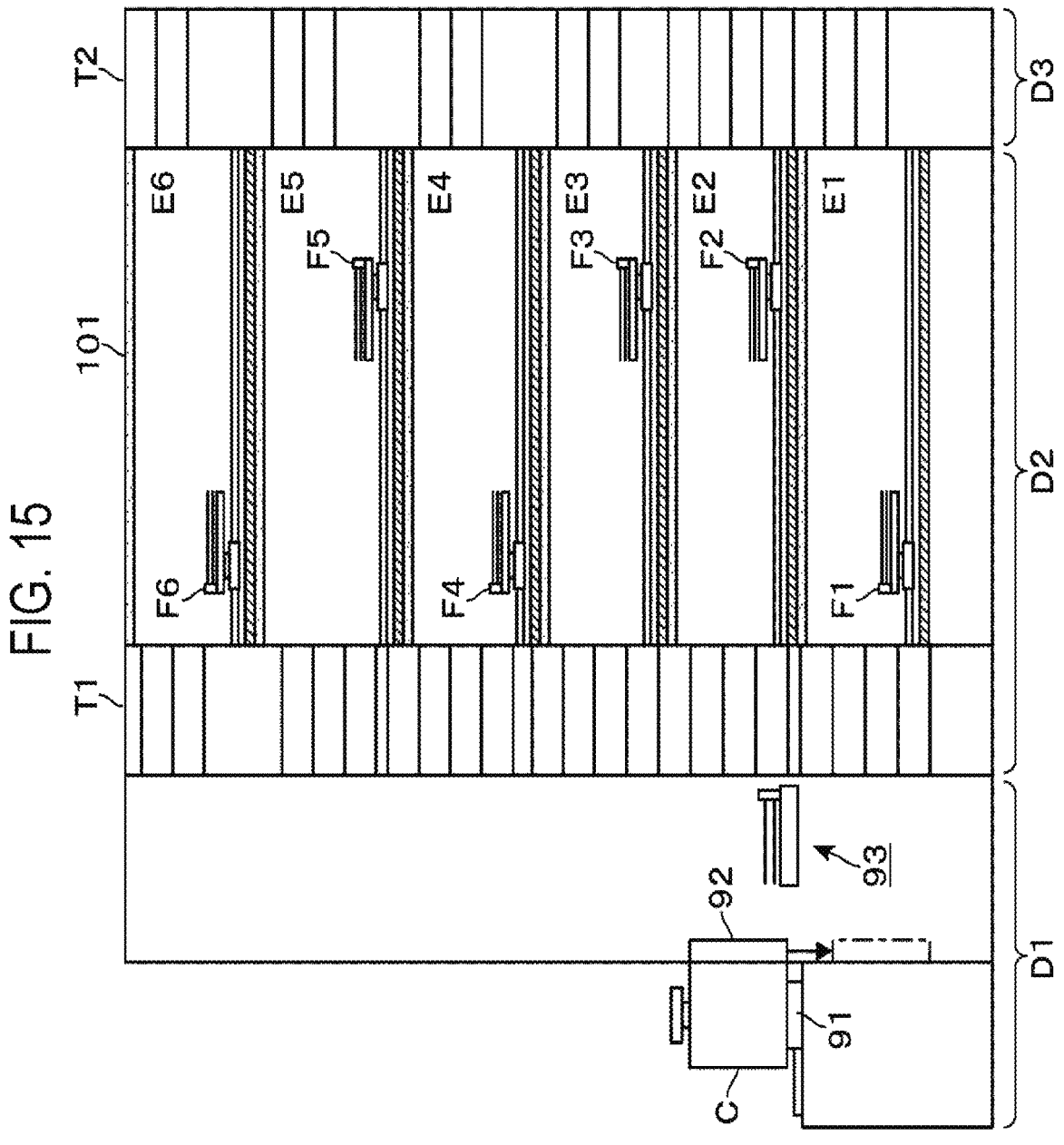
FIG. 15 is a vertical cross-sectional view illustrating a coating and developing apparatus.
Figure 16:
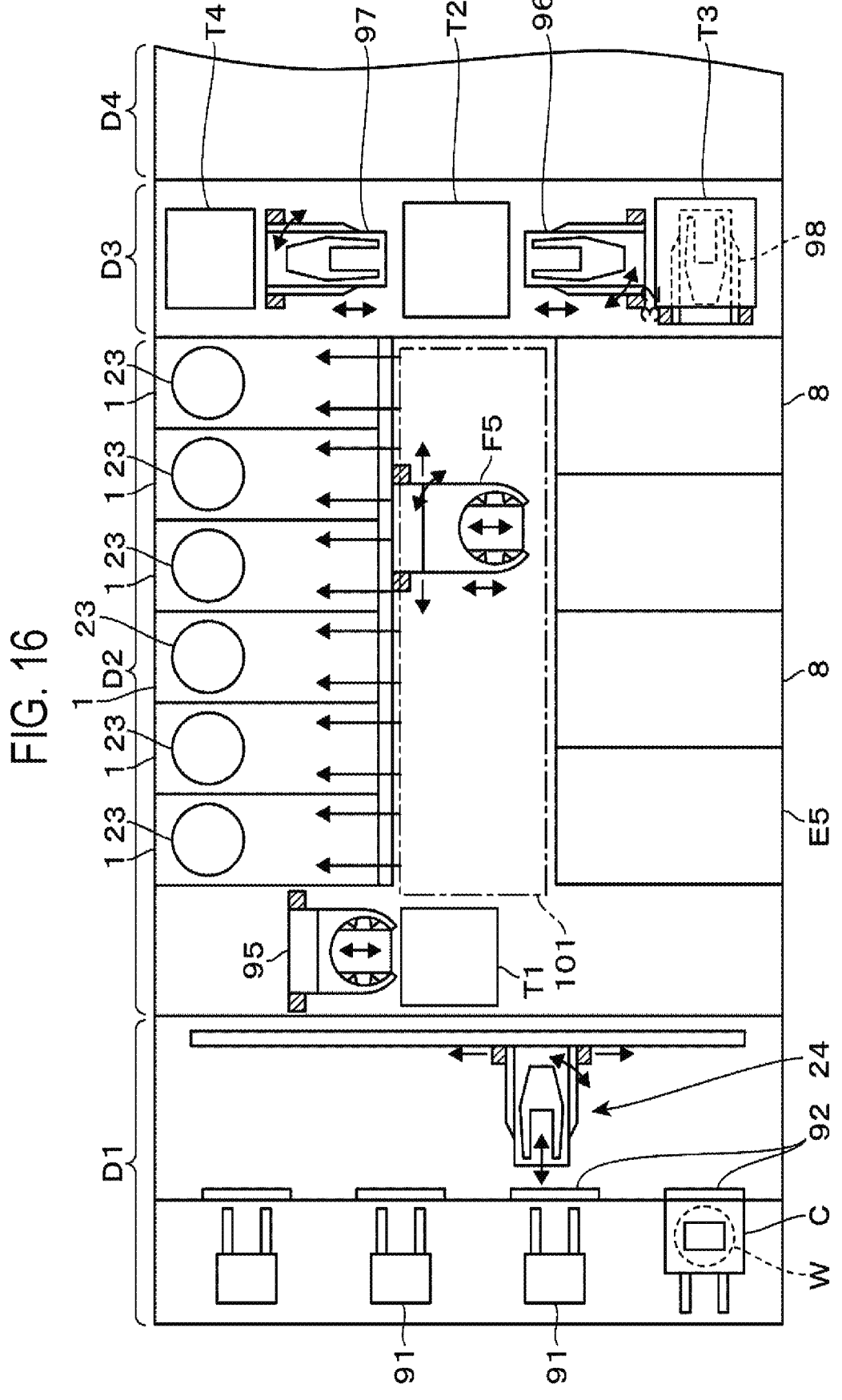
FIG. 16 is a plan view illustrating the coating and developing apparatus.

Next, a coating and developing apparatus provided with the heat treatment apparatuses 1, 1A to 1C described above will be described. FIGS. 15 and 16 are a schematic vertical cross-sectional side view and a schematic plan view of the coating and developing apparatus, respectively. This coating and developing apparatus is constructed by linearly connecting a carrier block D1, a processing block D2, and an interface block D3 in this order. An exposure apparatus D4 is connected to the interface block D3 on the side opposite to the connection direction of the processing block D2. The carrier block D1 has a role of carrying a carrier C into and out of the coating and developing apparatus, and includes a stage 91 for the carrier C, an opening and closing part 92 configured to be raised and lowered to open and close the lid of the carrier C, and a transfer mechanism 93 configured to transport the wafer W from the carrier C through the opening and closing part 92.

The processing block D2 is configured by stacking unit blocks E1 to E6 in order from the bottom. The unit blocks E1 to E3 each include a resist coating apparatus configured to coat a resist as a liquid processing apparatus 8, and form a resist film on a wafer W. The unit blocks E4 to E6 have substantially the same configuration as the unit blocks E1 to E3, but each include, instead of the resist coating apparatus, a developing apparatus that supplies the liquid developer to the wafer and performs the developing process. FIG. 16 illustrates the unit block E5.

The unit block E5 is provided with a transport mechanism F5 that moves along a linear transport path from the carrier block D1 to the interface block D3. Developing apparatuses, which are liquid processing apparatuses 8, are arranged on the right side of the transport path when viewed from the carrier block D1. Further, the heat treatment apparatuses 1 according to the present disclosure are arranged on the left side of the transport path when viewed from the carrier block D1. A shelf unit U7 including stacked modules is provided at the transport path near the carrier block B1. A wafer W is transferred between a transport arm 103 and a transport mechanism A5 via a transfer module of the shelf unit U7 and a transport arm 104.

As illustrated in FIG. 15, a filter 101 is provided at the ceiling of the transport path. By a fun filter unit (FFU) (not illustrated), an air in a clean room in which the coating and developing apparatus is installed is supplied to the filter 101 and supplied downward from the filter 101. When the exhaust is performed in the lid 21 of the processing chamber 20 of the heat treatment apparatus 1, the supplied air is introduced into the housing 10 of the heat treatment apparatus 1 and supplied onto the stage 23. That is, the atmosphere around the stage 23 is formed by the air. Therefore, the first gas supplied to the wafer W in the heat treatment apparatus 1 has a higher humidity than the air supplied via the filter 101.

The tower T1 illustrated in FIG. 1 is provided near the carrier block D1 side and extends vertically across the respective unit blocks E1 to E6. A transfer module TRS is provided at a height of each of the unit blocks E1 to E6. A transfer arm 95 that is movable upward and downward to transfer the wafer W to and from the tower T1 is provided near the carrier block D1. Further, in FIG. 15, the transport mechanisms 11 of the unit blocks E1 to E6 are indicated as F1 to F6.

The interface block D3 includes towers T2, T3, and T4 extending vertically across the unit blocks E1 to E6. The wafers W are transferred to and from towers T2 and T3 by an interface arm 96 that is movable upward and downward, and to and from towers T2 and T4 by an interface arm 97 that is movable upward and downward, respectively. An interface arm 98 is also provided to transfer wafers W between the tower T2 and the exposure apparatus D4. Modules such as a transfer module TRS are stacked in the tower T2. The towers T3 and T4 are also provided with modules, but a description thereof is omitted here.

In this coating and developing apparatus, wafers W transported by a carrier C are transported to unit blocks E1 to E3, and are subjected to a resist film formation process and a heating process in order, as described above. Then, the wafers W are transported to the exposure apparatus D4 via the transfer module TRS at the height of each of the unit blocks E1 to E3 of the tower T2 of the interface block D3, and subjected to an exposure process. The exposed wafers W are transported to the transfer module TRS at the height of each of the unit blocks E4 to E6 of the tower T2. Subsequently, the wafers W are transported to the heat treatment apparatuses 1 in the unit blocks E4 to E6, subjected to the heat treatment described above, then transported to the developing apparatus in which the wafers are subjected to a developing process in order, such that resist patterns are formed thereon, respectively, and returned to the carrier C.

As described above, it should be understood that the embodiments disclosed herein are exemplary in all aspects and are not restrictive. The above-described embodiments may be omitted, substituted, modified, and combined in various ways without departing from the scope and spirit of the appended claims.

Examples

In order to verify the effects of the heat treatment apparatuses according to the present disclosure, examples in which the heat treatment apparatus 1 illustrated in the first embodiment was used, the humidities of first gases were set to 20%, 50%, and 68%, respectively, and wafers W were processed in the same manner as in the example illustrated in the first embodiment were taken as Examples 1, 2, and 3, respectively. Each example was repeated three times and the line width of the resist pattern was measured.

Figure 17:
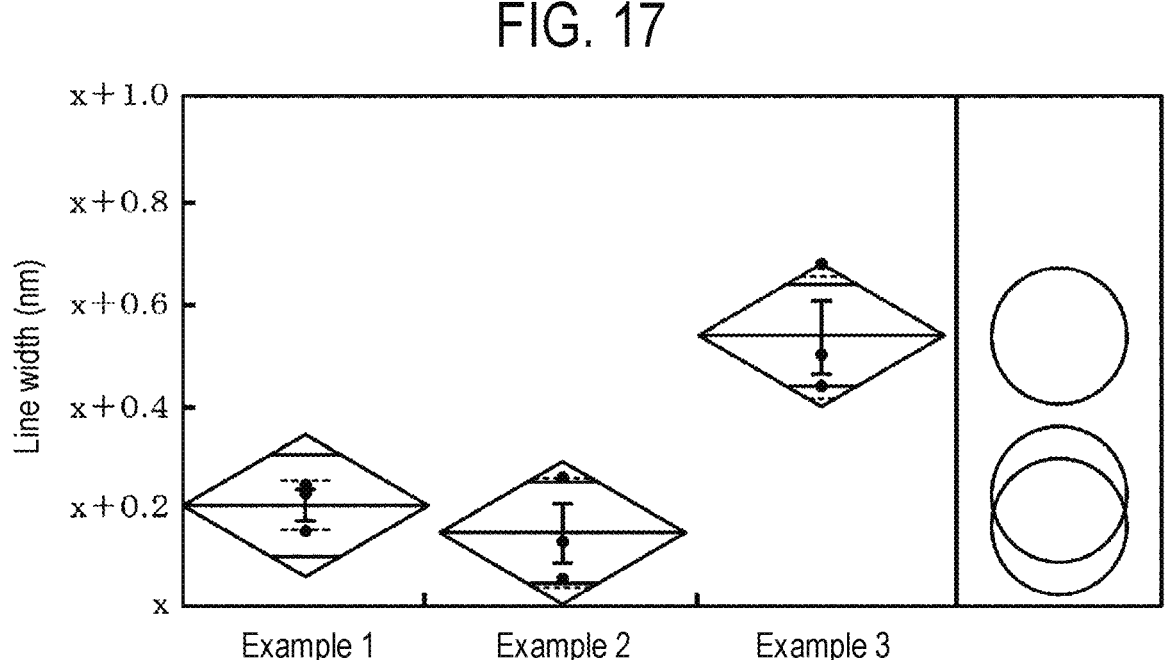
FIG. 17 is a graph showing results of embodiments.

FIG. 17 shows the results, and the black dots in the figures indicate the measured values of the line widths of the resist patterns measured in Examples 1 to 3. The rhombus portion in each example is a mean rhombus, in which the horizontal line in the center indicates the mean value of each of Examples 1 to 3, and the upper and lower points of the rhombus portion indicate the upper and lower limits of the opposite 95% confidence intervals of each example. In the mean rhombuses, lines drawn at positions spaced vertically away from the mean values of Examples 1 to 3 indicate overlap marks, respectively. Further, bars extending vertically from the means are mean error bars, and dashed lines indicate standard deviation lines. Also shown at the right side of the graph are comparison circles of Student's t-test (with a significant difference of 0.05) for each combination.

According to this result, there was no significant difference in the line widths of resist patterns between Example 1 and Example 2. Meanwhile, the line width in Example 3 was significantly thicker than those in Examples 1 and 2, such that there was a difference of about 0.4 nm in the line width among Examples 1 and 2 and Example 3. As described above, the line width of the resist pattern becomes wider as the reaction rate increases. Therefore, by setting the humidity of the first gas to be higher than 60%, it is possible to significantly improve the reaction rate and thus to increase the line width.

EXPLANATION OF REFERENCE NUMERALS

1: heat treatment apparatus, 3: gas supply, 23: stage, 27: lifting mechanism, W: wafer

What is claimed is:

1. A method of processing a substrate for heat-treating a metal-containing resist film formed on a surface of the substrate, comprising:
   a first heat-treatment step supplying a first gas to the substrate; and
   a second heat-treatment step supplying a second gas after the first heat-treatment step,
   wherein the first gas has a higher humidity than the second gas.

2. The method of claim 1, wherein the second gas is an inert gas.

3. The method of claim 1, wherein the first gas is air with adjusted humidity.

4. The method of claim 1, wherein the second heat-treatment step includes increasing a temperature of the substrate higher than a temperature of the substrate in the first heat-treatment step.

5. The method of claim 1, wherein at least one of the first gas and the second gas is a mixture of two gases having different humidities.

6. A non-transitory computer-readable storage medium storing a program that causes an apparatus to execute the method of claim 1.

7. A substrate processing apparatus for heat-treating a metal-containing resist film formed on a surface of a substrate, comprising:

a stage that heats the substrate;

a gas supply that supplies a first gas and a second gas; and a controller, wherein the controller is configured to control the gas supply to:

supply the first gas to the substrate; and supply the second gas to the substrate after supplying the first gas, and wherein the first gas has a higher humidity than the second gas.

8. The method of claim 1, wherein the first heat-treatment step includes promoting condensation of the metal-containing resist film.

* * * * *